United States Patent [19]

Hoffmann et al.

[11] Patent Number: 5,276,643
[45] Date of Patent: Jan. 4, 1994

[54] INTEGRATED SEMICONDUCTOR CIRCUIT

[75] Inventors: Kurt Hoffmann, Taufkirchen; Rainer Kraus, Munich; Oskar Kowarik, Grafing, all of Fed. Rep. of Germany

[73] Assignee: Siemens Aktiengesellschaft, Munich, Fed. Rep. of Germany

[21] Appl. No.: 799,907

[22] Filed: Nov. 26, 1991

Related U.S. Application Data

[63] Continuation of Ser. No. 393,666, Aug. 11, 1989, abandoned.

[30] Foreign Application Priority Data

Aug. 11, 1988 [EP] European Pat. Off. ............ 88113074

[51] Int. Cl.⁵ .............................................. G11C 7/06
[52] U.S. Cl. ................... 365/189.8; 365/201; 365/203; 365/205; 365/208; 365/189.5
[58] Field of Search .............. 365/207, 208, 201, 203, 365/205, 185, 210, 189.8, 189.5

[56] References Cited

U.S. PATENT DOCUMENTS

| | | | |
|---|---|---|---|
| 4,653,029 | 3/1987 | Sato | 365/205 |
| 4,692,642 | 9/1987 | Fukuzo et al. | 365/205 |
| 4,694,205 | 9/1987 | Shu et al. | 365/205 |
| 4,736,343 | 4/1988 | Hidaka et al. | 365/205 |
| 4,803,386 | 2/1989 | Kraus et al. | 365/205 |
| 4,825,417 | 4/1989 | Seo | 365/205 |
| 4,843,595 | 6/1989 | Suzuki | 365/190 |
| 4,845,675 | 7/1989 | Krenik et al. | 365/190 |
| 5,040,148 | 8/1991 | Nakai et al. | 365/208 |

Primary Examiner—Joseph E. Clawson, Jr.
Attorney, Agent, or Firm—Herbert L. Lerner; Laurence A. Greenberg

[57] ABSTRACT

An integrated semiconductor circuit includes word lines and bit lines. A memory region has at least one memory cell field with memory cells addressable through the word lines and the bit lines, and a number of evaluator circuits corresponding to the number of the bit lines. Each of the evaluator circuits is connected with one of the bit lines and divides the one bit line into two at least approximately identical bit line halves. Logic units of a block perform digital processing of data read-out of the memory region through the bit lines and evaluated. Each of the logic units is connected to the two bit line halves of one of the bit lines. Various operating modes of the block of logic units are selected with mode select signals.

17 Claims, 6 Drawing Sheets

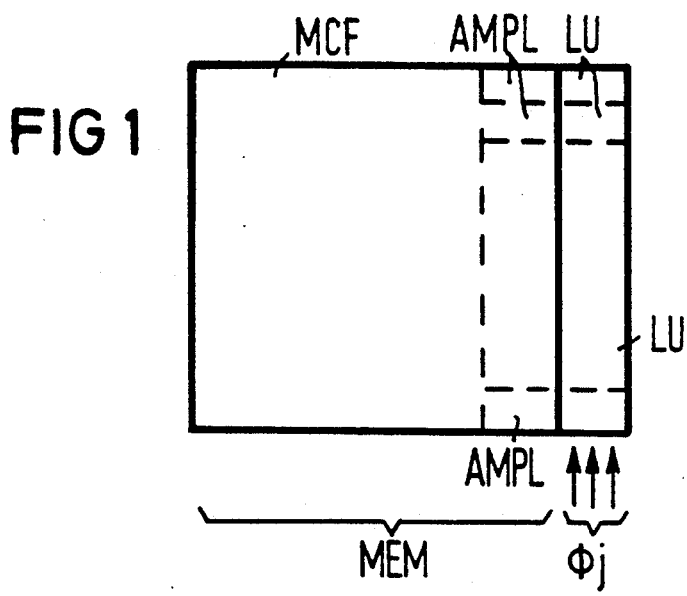
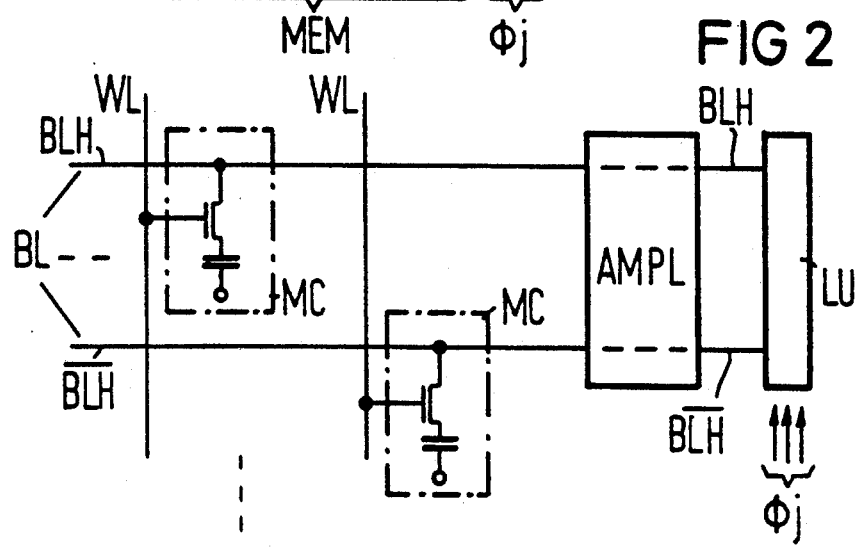
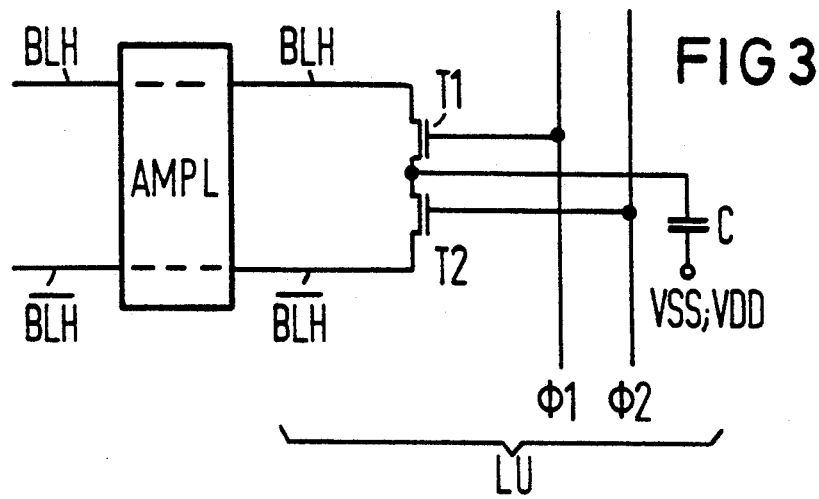

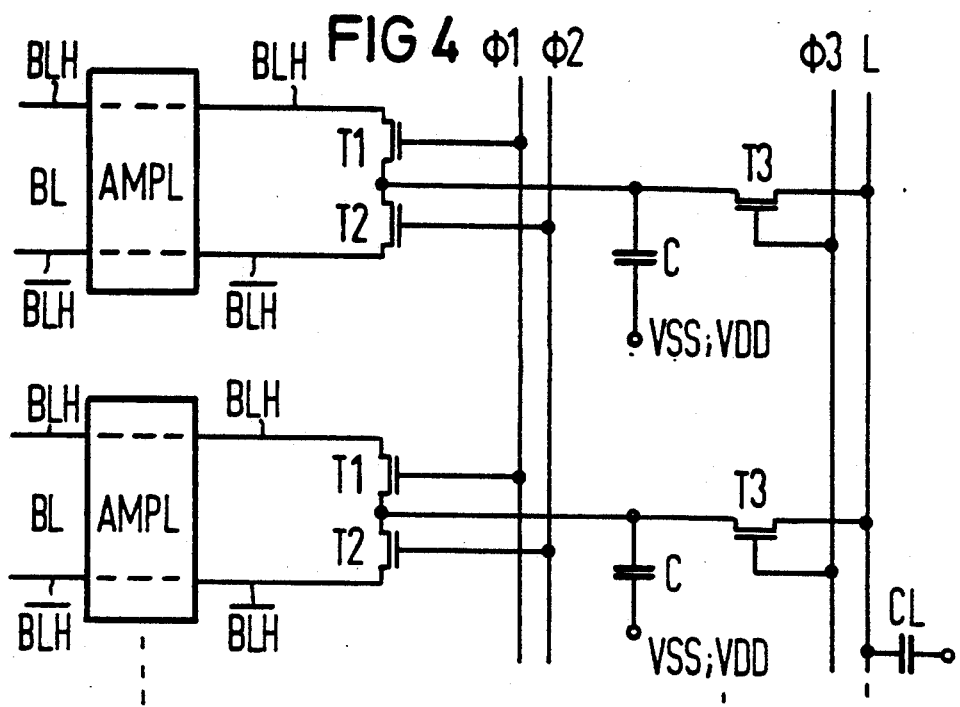
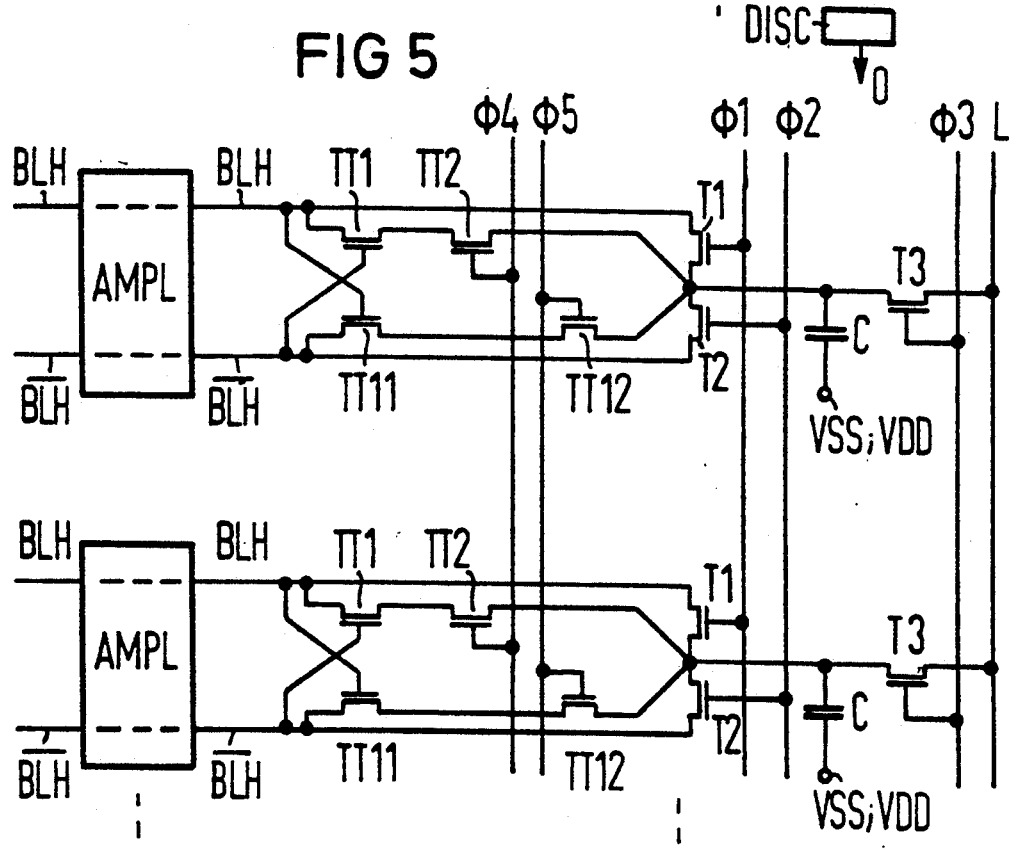

INTEGRATED SEMICONDUCTOR CIRCUIT

This application is a continuation of application Ser. No. 393,666, filed Aug. 11, 1989, now abandoned.

The invention relates to an integrated semiconductor circuit, having a memory region, the memory region includes at least one memory cell field with memory cells addressable through word lines and bit lines, and the memory region also includes a number of evaluator circuits corresponding to the number of bit lines, each evaluator circuit being connected with a bit line in such a way that it divides it into two at least approximately identical bit line halves.

In modern data processing, graphics as well as pattern processing and the linkage of mass data in data bank systems, are increasingly important. A common feature of these activities is that very large quantities of data must be processed. Traditional data processing systems perform the processing serially. This takes a large amount of time, because, for instance, when searching for a certain term, a great number of data must be read serially out of a memory region, and compared in the processor with the term sought, until the desired term has been found.

A partial solution to this problem is the use of contentaddressable integrated semiconductor memories (CAMs). However, this has two disadvantages: First, the CAM memories available at this time have very little memory capacity (a maximum of 8 k bits) as compared with modern RAM or ROM memory modules that are available (1 megabit of memory capacity); see IEEE Journal of Solid-State Circuits, Vol. SC-20, No. 5, October 1985, pp. 951-956. Second, these memory modules can only perform associative functions, but not other digital functions (such as logical or arithmetic functions). Moreover, CAM memory modules cannot be operated like conventional RAM or ROM memory modules.

Another partial solution is the combination of special processors with memory modules in parallel computers (known as "transputers"). Transputers, however, are expensive, tedious to configure and not universally usable, or in other words they are not usable for arbitrary applications.

It is accordingly an object of the invention to provide an integrated semiconductor circuit, which overcomes the hereinafore-mentioned disadvantages of the heretofore-known devices of this general type and which further develops a conventional semiconductor memory module with as little effort as possible, in such a way that its use shortens the time usually required and in such a way that it is usable as universally as possible. With the foregoing and other objects in view there is provided, in accordance with the invention, an integrated semiconductor circuit, comprising word lines and bit lines; a memory region including at least one memory cell field with memory cells addressable through the word lines and the bit lines, and a number of evaluator circuits corresponding to the number of the bit lines, each of the evaluator circuits being connected with one of the bit lines and dividing the one bit line into two at least approximately identical bit line halves; and a block of logic units, the logic units performing digital processing of data read-out of the memory region through the bit lines and evaluated, each of the logic units being connected to the two bit line halves of one of the bit lines, and including means for selecting various operating modes of the block of logic units with mode select signals.

In accordance with another feature of the invention, the operating modes include a first mode in which all of the mode select signals are deactivated, so that the read-out, evaluated data remain unchanged.

In accordance with a further feature of the invention, each of the logic units includes at least two first transistors performing data inversion of the read-out, evaluated data as a second mode, the first transistors have drains, sources and gates, each of the logic units includes a charge capacitor having first and second terminals, and within a respective one of the logic units: the drains of the first transistors are connected to the first terminal of the charge capacitor, the second terminal of the charge capacitor is connected to a fixed potential, each of the sources of the first transistors is connected to a respective one of the two bit line halves, and the mode select signals including two first mode select signals fed to the gates of the first transistors.

In accordance with an added feature of the invention, there is provided a a common line prechargeable to a fixed potential, third transistors connected between the common line and the first terminals of the charge capacitors, a discriminator circuit connected to the common line for recognition of the charge state of the common line, the mode select signals including a second mode select signal controlling the third transistors for performing an i-multiple logic comparison of the read-out, evaluated data as a third mode, where i=number of the logic units, and the discriminator circuit having an output at which the outcome of the i-multiple logical comparison is present.

In accordance with an additional feature of the invention, there is provided a support capacitor connected between the common line and a fixed potential.

In accordance with yet another feature of the invention, there are provided two first and two second transfer transistors having channels and gates, one of the first and one of the second transfer transistors being connected with the channels thereof in series between the drains of the two first transistors and one of the two bit line halves, the other of the first and the other of the second transfer transistors being connected with the channels thereof in series between the drains of the two first transistors and the other of the two bit line halves; the mode select signals including two third mode select signals each being fed to the gate of a respective one of the two second transfer transistors; the gate of the one first transfer transistor being connected to the other bit line half, and the gate of the other first transfer transistor being connected to the one bit line half.

In accordance with yet a further feature of the invention, there are provided two buffer store capacitors having first and second electrodes, the gates of the two first transfer transistors each being connected to the first electrode of a respective one of the two buffer store capacitors, defining two respective memory nodes therebetween; the second electrodes of the buffer store capacitors being connected to a fixed potential; memory transistors having channels and gates, each of the channels of the memory transistors being connected between a respective one of the two memory nodes and a corresponding one of the bit line halves; and the mode select signals including a fourth mode select signal connected to the gates of the memory transistors. The mode select signals may instead include two fourth mode select signals each being connected to the gate of a respective one of the memory transistors.

In accordance with yet an added feature of the invention, each of the logic units includes a shift transistor having a channel and a gate, the channel of the shift transistor being connected between the first terminal of the charge capacitor and one of the bit line halves of a bit line before it or after it in order; and the mode select signals including a fifth mode select signal fed to the gate of the shift transistor as a shift signal.

In accordance with yet an additional feature of the invention, the logic units and the bit lines are disposed in a given order from a first logic unit and a first bit line to a last logic unit and a last bit line, and the first terminal of the charge capacitor is connected through the shift transistor in the first logic unit with the last bit line, as seen in the given order. Additionally, first terminal of the charge capacitor may be connected through the shift transistor in the last logic unit with the first bit line, as seen in the given order.

In accordance with again another feature of the invention, the buffer store capacitors are stray capacitances of the first transfer transistors.

In accordance with again a further feature of the invention, there are provided static memory cells instead of the charge capacitors of each of the logic units.

In accordance with a concomitant feature of the invention, the memory cells are dynamic random access memory cells, static random access memory cells, or memory cells of the read-only type.

Other features which are considered as characteristic for the invention are set forth in the appended claims.

Although the invention is illustrated and described herein as embodied in an integrated semiconductor circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

FIG. 1 is a diagrammatic, global overview of the circuit according to the invention, which is not to scale;

FIG. 2 is a more detailed block and schematic circuit diagram of a portion of FIG. 1; and FIGS. 3-9 are block and schematic circuit diagrams of advantageous embodiments of individual logic units of the circuit.

Figure 6:
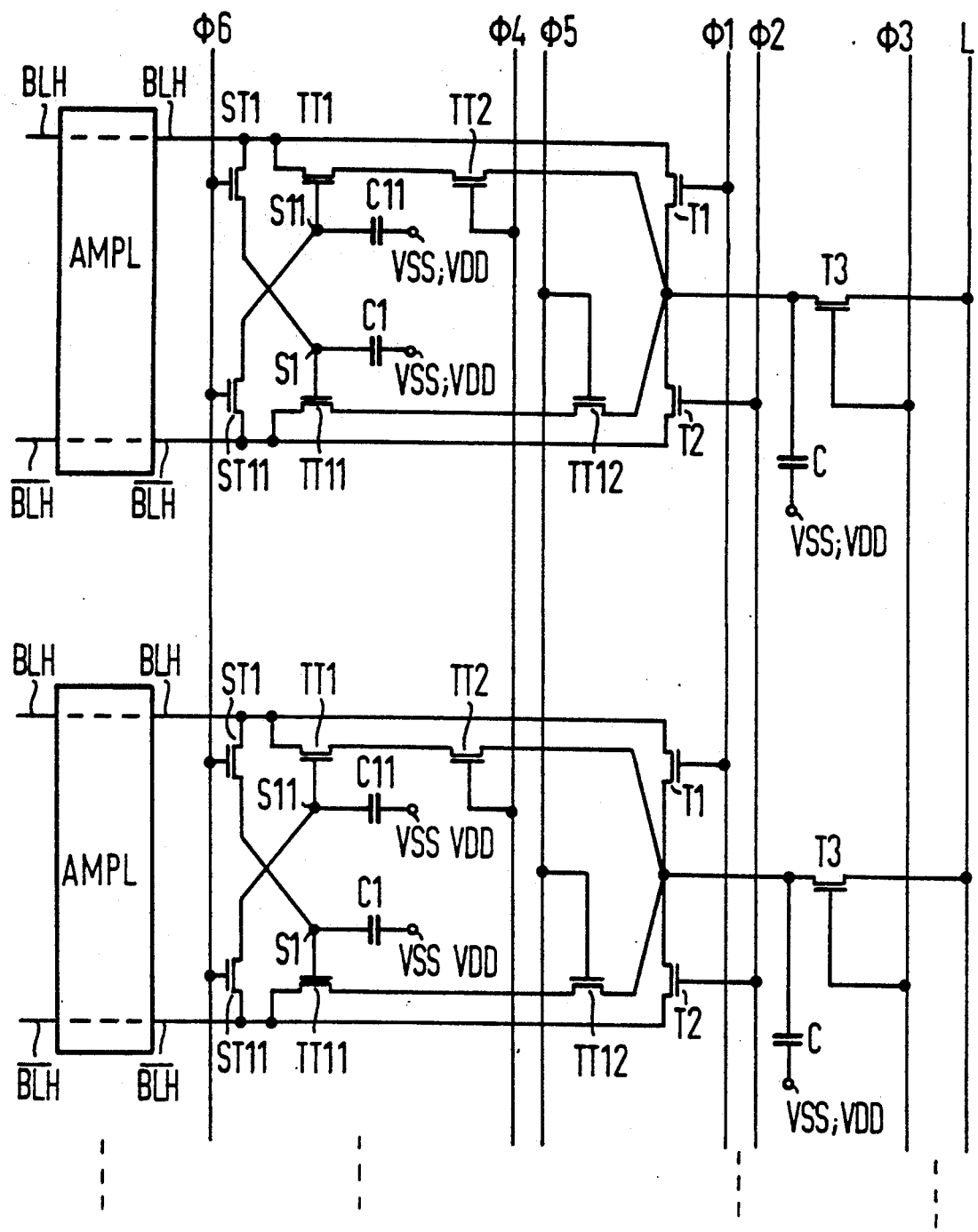

Referring now to the figures of the drawings in detail and first, particularly, to FIG. 1 thereof, there is seen an integrated semiconductor circuit according to the invention which includes not only a memory region MEM, which is known in the art, but also a block of logic units LU. The memory region MEM includes one or more memory cell fields MCF, with memory cells MC that are addressable through word lines WL and bit lines BL. It also includes a number of evaluator circuits AMPL corresponding to the number of bit lines BL. Each evaluator circuit AMPL, as shown in detail in FIG. 2, is connected with a bit line BL in such a way that it divides the bit lines into two at least approximately identical halves BLH, $\overline{BLH}$. For the present invention, it does not matter whether this division is carried out according to the open bit line concept or the folded bit line concept.

The integrated semiconductor circuit according to the invention furthermore includes a block of the logic units LU. Each logic unit LU is connected to one bit line BL through its two bit lines halves BLH, $\overline{BLH}$. The connection may be carried out inside or outside the particular logic unit LU, for instance by extending the bit line BL as far as the applicable logic unit LU, as shown.

The logic units LU serve to provide digital processing of data A, read out of the memory region MEM through the bit lines BL and evaluated and amplified in the evaluator circuits AMPL, as well as data $\overline{A}$ which is complementary to the data A. The latter is produced in a known fashion in the evaluation and amplification process. The term "digital processing" is understood in particular to mean the logical linkage of two bits (OR, AND etc.), inversion of one or more bits, logical comparisons of words with one another, and arithmetic operations. The block of logic units LU can be operated in various modes MODk (k=1...n) for this purpose. The selection of the modes MODk is effected with mode select signals $\phi j$ (j=1...m).

The structure and function of the invention will be described below, mostly in conjunction with a single logic unit LU. Regardless, all of the logic units LU of the block are operated parallel to one another.

In a first mode MOD1, all of the mode select signals $\phi j$ are deactivated, which likewise deactivates all of the logic units LU. In operation, the read-out, evaluated data A thus remain unmodified, in this embodiment of the invention. The operation of the integrated circuit is accordingly identical in the first mode MOD1 with that of a comparable semiconductor memory module that does not include the block of logic units LU. This makes the semiconductor circuit according to the invention electrically compatible with a corresponding semiconductor memory module.

In the exemplary embodiment of FIG. 3, each logic unit LU includes at least two first transistors T1, T2 and one charge capacitor C. The transistors T1, T2 serve to provide an inversion of the evaluated data A present on the bit lines BL. The drains of the transistors T1, T2 are connected in common to a first terminal of the charge capacitor C. The second terminal of the charge capacitor C is connected to a fixed potential. It is recommended that one of the potentials serving to provide voltage to the integrated semiconductor circuit, VSS (corresponding to ground) or VDD, be used as the fixed potential. The source of the first transistor T1 is connected to one bit line half BLH; the source of the the other transistor T2 is connected to the other bit line half $\overline{BLH}$. Two first mode select signals $\phi 1$, $\phi 2$ are connected to the gates of the first and second transistors T1, T2, respectively.

The inversion of the data A that thus becomes possible constitutes the second mode MOD2. The inversion of the data A in operation is effected as follows: First, as is usual with every semiconductor in the prior art, a datum A is read out of a memory cell MC, fed through the bit line half associated with the memory cell MC (in this example, this is assumed to be the one bit line half BLH) to the evaluator circuit AMPL, and evaluated and amplified there. The datum A is also present at the source of the first transistor T1. Then, the one of the two first mode select signals $\phi 1$, $\phi 2$ that is connected to the first transistor T1 (that is, the signal $\phi 1$) is activated. The datum A reaches the charge capacitor C and charges or discharges it, depending on the value (logical "1", logical "0") of the datum A. Next, the one first mode select signal φ1 is deactivated, and the other first mode select signal φ2 is activated. Consequently the one transistor T1 blocks; the other transistor T2 conducts. The charge stored on the charge capacitor C accordingly reaches the evaluator circuit AMPL, through the other bit line half (in this example, $\overline{BLH}$). The evaluator circuit AMPL is then activated again, so that it evaluates the datum that is present. However, since the datum A in this new evaluation is present on the other bit line half $\overline{BLH}$ (compared with the original evaluation), the evaluator circuit AMPL flips into its complementary state, and as a result a datum $\overline{A}$ that is inverted with respect to the originally read-out evaluated datum A is then present on the original one bit line half BLH. This datum can then be read out of the semiconductor circuit through the usual memory devices, and/or inscribed into an arbitrary memory cell MC on the same bit line half BLH. The original datum A can be inscribed in memory cells MC that are present on the other bit line half $\overline{BLH}$.

However, if the read-out, evaluated datum A prior to the data inversion is present on the other bit line half $\overline{BLH}$ (this is conventionally decided, in a known manner, by a predetermined, freely selectable bit of the word line address), then correspondingly the function of the two first mode select signals φ1, φ2 can be exchanged with one another (and optionally also controlled by the aforementioned bit of the word line address). The exchange is not necessary, however, because once evaluation has taken place, data that are always complementary to one another are present on both bit line halves BLH, $\overline{BLH}$ (assuming intact memories); in that case, in performing the second mode MOD2, in the strict sense, it is not the datum A originally read out (on the other bit line half $\overline{BLH}$) and evaluated that is inverted on the one bit line half BLH, but rather the datum $\overline{A}$ complementary to it. However, this is of no significance, because subsequent to the activation of the mode select signals φ1, φ2 by the new evaluation in the evaluator circuit AMPL, a datum $\overline{A}$ complementary to the originally read-out datum A is produced on the second bit line half $\overline{BLH}$.

As is well known, in an integrated semiconductor memory, by addressing a single memory cell MC through an addressed word line WL and a bit line address, the data Ai stored in all of the memory cells MC on the addressed word line WL are read out in parallel through the bit lines BLi and evaluated and amplified by means of all of the evaluator circuits AMPL. The selection of a specific datum A from the multitude of data Ai by means of a bit line address takes place next. In this operation, that datum A that is present on the addressed bit line BL and that was evaluated and amplified is fed to an external bit line. Based on these conditions, the second mode MOD2 described above accordingly also runs parallel for the entire block of logic units LU. The second mode MOD2 thus permits a simultaneous inversion of data Ai of all of the memory cells MC of one word line WL.

In the embodiment of FIG. 4, the block of logic units LU also includes a common line L, which as is generally conventional with longer lines, has a certain self-capacitance (not shown in FIG. 4). The common line L is accordingly prechargable to a fixed potential, for example to the potential VDD or VSS, in a manner similar to a capacitor. It is also connected to a discriminator circuit DISC. The discriminator circuit DISC serves to recognize the charge state of the common line L.

According to a further feature of the invention shown in FIG. 4, the common line L is connected to a support capacitor CL.

The support capacitor CL is connected in turn to one of the fixed potentials VDD; VSS. In operation, the support capacitor CL has a supporting effect in terms of the prechargeability of the common line L, since it reinforces the effect of the aforementioned self-capacitance.

In each logic unit LU, the common line L is connected through the current-carrying path (or channel in MOS transistors) of one third transistor T3, with the first terminal of the charge capacitor C. The third transistors T3 are controlled by a second mode select signal φ3, so that they are switchable. This configuration permits the comparison of i data with one another (i=the number of logic units LU) in the sense of a logical linkage serving as a third mode MOD3 of the integrated semiconductor circuit according to the invention.

Depending on the circuit configuration of the block of logic units LU (in other words, depending on whether the third transistors T3 are p or n-channel transistors; whether the second mode select signal φ3 is "positive-going" or "negative-going", which depends on the channel type of the third transistors T3; whether the common line L is precharged to the supply potential VDD or to ground VSS of the integrated semiconductor circuit; and depending on the dimensioning of the discriminator circuit DISC), the third mode MOD3, as a logical linkage, makes the following Boolean operations possible: AND, OR, NAND, NOR. For further information on the operation and detailed configuration of the discriminator circuit DISC and of a possible precharging device for the common line L, reference may be made to published International Application PCT/DE 88/00158 of the present applicant.

The operation will now be explained briefly: First, by activation of a selected word line WL, the data Ai stored in all of the memory cells MC connected to the word line WL are read through the associated bit line BL and evaluated and amplified by means of the associated evaluator circuits AMPL. Subsequently, all of the bit lines BLi, on one of their bit line halves BLH, $\overline{BLH}$ (for instance, the first bit line halves BLH), have the logical datum A that has been read out of the memory cell MC associated with the word line WL through the respective bit line BL. By activation of the applicable one of the first mode select signals φ1, φ2 (in this example, φ1), the data Ai travel in parallel through the transistor (for example, T1) associated with the activated first mode select signal (φ1 is assumed), to the first terminals of the charge capacitors C and charge or discharge it depending on the value of the applicable datum A (logical 1 or logical 0), and advantageously the activated first mode select signal (φ1 has been assumed) remains activated, in order to keep the evaluator circuits AMPL connected in an electrically conductive manner with the charge capacitors C. However, it is also possible for the one first mode select signal φ1 to be deactivated instead.

The common line L should be precharged to one of the fixed potentials VDD, VSS no later than this time. If the support capacitor CL is used, it is connected to one of the fixed potentials VDD, VSS.

Some of the logical comparisons that are possible by this method with the present apparatus will now be described:

AND comparison: The common line L is assumed to be precharged to the fixed potential VDD (VDD would, for instance, correspond in value to the level of a datum at "logical 1"). The second mode select signal $\phi3$ is then activated. If previously a datum A having the value "logical 1" was stored in all of the charge capacitors C, which would be quantitatively equal to the value of the fixed potential VDD, then all of the third transistors T3 are blocked (assuming n-channel transistors); the common line L remains precharged. This is recognized by the discriminator circuit DISC; at its output 0, it emits a corresponding signal, which in this case indicates that the result of the logical "AND" linkage equals "logical 1".

On the other hand, if a logical 0 was stored as datum A at least at one of the charge capacitors C, which would be quantitatively equal to the value of the fixed potential VSS, then the third transistor T3 associated with this at least one charge capacitor C is conducting, which leads to a drop in the potential of the common line L. This is recognized in turn by the discriminator circuit DISC; at its output 0 it emits a signal which is complementary to the above signal, which indicates that the outcome of the logical "AND" linkage is equal to "logical 0".

Depending on the selected level of the output signal 0 of the discriminator circuit DISC for the case of the presence of a logical 1 at all of the charge capacitors C, it is thus possible to perform both an AND and a NAND comparison.

If the common line L is precharged to the value of the fixed potential VSS (=ground), then depending on the selection of the value of the signal at the output 0 of the discriminator circuit DISC for the case in which all of the data stored in the charge capacitors C are equal to logical 0, the functions OR or NOR can be attained as the third mode MOD3 (that is, logical comparison). One skilled in the art can readily carry this out, with the aid of the above discussions of AND and NAND comparisons. It is also favorable for activating the second mode select signal $\phi3$ to provide a level that is located between the fixed potentials VSS and VDD in terms of quantity. Additionally in this connection, reference can be made to the published International Application PCT-DE 88/00158 of the present applicant, the disclosure of which, where relevant, is hereby incorporated by reference. In particular, a configuration is also disclosed in that application which makes it possible to perform the logical comparisons AND, NAND, OR, NOR, selectively during operation.

However, if the second mode MOD2 is to be performed with the configuration of FIG. 4, then the third transistors T3 should be kept continuously blocked; that is, the second mode select signal $\phi3$ should be kept constantly inactive.

A further advantageous embodiment of the invention is shown in FIG. 5. In addition to the features already described, FIG. 5 shows the following features of each logic unit LU:

One first transfer transistor TT1; TT11 and one second transfer transistor TT2; TT12 are disposed between the drains of each of the first two transistors T1, T2, which serve the purpose of data inversion, and each of the two bit line halves BLH; $\overline{BLH}$ of one bit line BL. The current-carrying paths (or channels, in MOS transistors) of the transfer transistors are in series one after the other. The gates of the two second transfer transistors TT2; TT12 are respectively connected with one of two third mode select signals $\phi4$; $\phi5$. The gate of the one first transfer transistor TT1 is connected to the other bit line half $\overline{BLH}$. The gate of the other first transfer transistor TT11 is connected to the one bit line half BLH.

This embodiment permits a single or iterative performance of the Boolean operations XNOR, OR and NAND per bit line BL, as a fourth mode MOD4. In the case of a single performance, a single datum A which is read out of one memory cell MC and evaluated is compared with a comparison datum X, to be applied to the applicable logic unit LU, by means of the desired Boolean operation. That is, two bits are compared with one another. In the case of an iterative performance, a plurality of evaluated data Ap (p = number of the data) read out of a plurality of memory cells MC along a single bit line BL are compared with a plurality of comparison data Xp, to be applied to the applicable logic unit LU, by means of the desired Boolean operations (word for word comparison).

In detail, the fourth mode MOD4 takes the following course: Initially, the charge capacitors C of all of the logic units LU are charged to the fixed potential VDD (the value of which corresponds in turn to the value of the level logical 1). The charging may be effected either through the common line L and the associated third transistors T3, or through the bit lines BL. In the latter case, the evaluator circuits AMPL are put in an arbitrary evaluation state, as a result of which a logical 1 is present at one of the bit line halves BLH, $\overline{BLH}$. The means for doing this are well known to one skilled in the art. For each logic unit LU, the one of the two first transistors T1, T2 that is connected to the particular bit line half BLH, $\overline{BLH}$ at which the logical 1 is present is then made conductive, by means of the one or the other of the two first mode select signals $\phi1$; $\phi2$ associated therewith. Thus the logical 1 reaches each charge capacitor C as a fixed potential VDD; the charge capacitors are precharged. Subsequently, both first mode select signals $\phi1$, $\phi2$, like the second mode select signal $\phi3$, remain deactivated.

For the ensuing operations, a single bit line BL, with the logic unit LU connected thereto, will be considered; the corresponding operations at the remaining bit lines BL and logic units LU will not be described. In a known manner, a datum A, which is stored in a memory cell MC connected to the bit line BL and addressed by a word line WL, is then read out and evaluated and amplified by means of the evaluator circuit AMPL. In the following discussion it is assumed that the datum A is present on the one bit line half BLH. Thus a datum $\overline{A}$ which is complementary to the datum A is present at the other bit line half $\overline{BLH}$. The one mode select signal $\phi4$ then assumes the value of the comparison datum X, while the other third mode select signal $\phi5$ assumes the value of a comparison datum $\overline{X}$ complementary to the comparison datum $\overline{X}$.

If the read-out, evaluated datum A and the comparison datum X are identical, then either the one first transfer transistor TT1 and the other second transfer transistor TT12 are blocked (datum A=comparison datum X=logical 1), or the other first transfer transistor TT11 and the one second transfer transistor TT2 are blocked (datum A=comparison datum X=logical 0). In both cases, the logical 1 (=fixed potential VDD) stored on the charge capacitor C is thus maintained. Accordingly, the result of the Boolean operation "datum A XNOR comparison datum X" = "logical 1 XNOR logical 1", or "logical 0 XNOR logical 0" = "logical 1" is present at the charge capacitor C.

However, if the read-out, evaluated datum A and the comparison datum X are not identical, then either both the one first transfer transistor TT1 and the one second transfer transistor TT2 (datum A = logical 0; comparison datum X = logical 1), or the other first transfer transistor TT1 and the other second transfer transistor TT12 (datum A = logical 1; comparison datum X = logical 0) are conducting. In each of these two cases, the particular bit line half BLH, $\overline{BLH}$ that has the state logical 0 (= fixed potential VSS = ground) (because either datum A = logical 0 or complementary datum $\overline{A}$ = logical 0) is connected through the aforementioned conducting transfer transistors to the first electrode of the charge capacitor C; the charge capacitor is thus discharged to the fixed potential VSS = ground.

In this way, a bit (datum A) stored in memory is compared with a comparison bit X.

If the aforementioned steps are repeated several times one after another (with the exception of the step of "precharging the charge capacitor C to the fixed potential VDD"), then a plurality of data Ap (stored in various memory cells MC along the one bit line BL) are compared (in chronological succession) with a plurality of data Xp (for example, Boolean operation XNOR); the final outcome is determined by the final state of the charge capacitor C (which in the meantime is never charged again to the fixed potential VDD). This final outcome can be applied through one of the two first transistors T1, T2 and the corresponding first mode select signal $\phi1$, $\phi2$ to the evaluator circuit AMPL and can be evaluated by it, so that it is stably available at the evaluator circuit AMPL and can, for instance, be read out through a data output of the memory region MEM. In this way, a word (data Ap), for instance, stored in memory cells MC along one bit line BL can be compared very quickly in the integrated semiconductor circuit with a sought out term (comparison data Xp) present in word form. The comparison itself takes place simultaneously in parallel for all of the bit lines BL. The outcomes at each individual bit line BL are capable of being read out in succession by the individual evaluator circuits AMPL, for instance through the aforementioned data output, by application of the individual bit line addresses.

With the present embodiment, the logic operations OR and NAND can also be performed, however, as follows:

a) OR operation

The fourth mode MOD4 is performed as described above in connection with the XNOR operation, with the following exception: Upon application of the datum A on the one bit line half BLH, the one third mode select signal $\phi4$ is connected to a datum $\overline{X}$ that is complementary to the comparison datum X; the other third mode select signal $\phi5$ is always deactivated. If the comparison datum X has the value logical 1, then both second transfer transistors TT2, TT12 are always blocked; the precharging is maintained at the charge capacitor C; as an outcome, this means logical 1. If the comparitor datum X in contrast has the value logical 0, then the one second transfer transistor TT2 is always conducting, because of the datum $\overline{X}$. The one first transfer transistor TT1, in contrast, is conducting precisely whenever the datum A has the value logical 0; in that case, the charge capacitor C is discharged to logical 0 = fixed potential VSS. Otherwise, the one first transfer transistor TT1 is blocked; as a result, the charge capacitor C remains charged.

b) NAND operation:

In contrast to the OR operation, the one third mode select signal $\phi4$ is always deactivated, while the comparison datum X is present at the other third mode select signal $\phi5$. The charge capacitor C is discharged to logical 0 only in the event that both the datum A (concerning which it is again assumed that it is present on the one bit line half BLH) and the datum X are equal to logical 1. Otherwise, at least one of the first and one of the second transfer transistors TT1, TT11, TT2, TT12 are always blocked.

FIG. 6 shows a further advantageous embodiment of the invention. It is distinguished from the embodiment of FIG. 5 by the following characteristics:

The gates of the two first transfer transistors TT1, TT11 are additionally connected to the first electrodes of two buffer store capacitors C1, C11, forming two memory nodes S1, S11. The second electrodes of the two buffer store capacitors C1, C11 are connected to one of the two fixed potentials VSS, VDD. Additionally, memory transistors ST1; ST11 are disposed with their channels between the two memory nodes S1; S11 and the corresponding bit line halves BLH; $\overline{BLH}$. The gates of these memory transistors are connected to a fourth mode select signal $\phi6$.

This embodiment makes it possible to operate the integrated semiconductor circuit according to the invention in a fifth mode MOD5. In the fifth mode MOD5, various operations are possible, for instance the Boolean operations AND, NAND, OR, NOR, XOR, XNOR. To this end, in each case in parallel for the entire block of logic units LU, a comparison datum X is applied to each bit line half BLH (or $\overline{BLH}$) (for instance, as already described, the same comparison datum X to all of the bit line halves BLH through the common line L and to the one first transistor T1 or through the data input of the semiconductor memory and the individual evaluator circuits AMPL; in the latter case, it is possible to apply various logical values of the comparison datum X to the various bit line halves BLH). The comparison data X (or Xi in the case of various comparison data) applied to the individual bit line halves BLH are then evaluated through the evaluator circuits AMPL, so that a datum $\overline{X}$ complementary to the comparison datum X forms at the respective other bit line halves $\overline{BLH}$ (the familiar flip-flop function of the evaluator circuits AMPL). Next, the fourth mode select signal $\phi6$ is activated, so that per bit line BL, the comparison datum X or the complementary datum $\overline{X}$ present on the bit line halves BLH, $\overline{BLH}$ reaches the first electrode of the associated memory node S1; S11 and is stored there. Subsequently, the fourth mode select signal $\phi6$ is deactivated again.

Alternatively to this manner of precharging the memory nodes S1, S11, it is also possible to read the comparison data Xi out of the memory cell field MCF in parallel for all of the bit lines BL. To this end, as usual, a specific word line WL is addressed, so that the data stored in all of the memory cells MC connected to the word line WL reach the bit lines BL parallel to one another and are evaluated and amplified by the evaluator circuits AMPL. The storage in the memory nodes S1, S11 is then effected by means of the fourth mode select signal $\phi 6$, as already described.

Then, the charge capacitors C of the block of logic units LU are precharged to the fixed potential VDD or VSS, as already explained for the above-described modes MODk. From then on, the actual logic operations can be performed.

This can be carried out in two different ways:
a) with bit-line orientation, and
b) with word-line orientation a) First, the bit-line oriented way will be described. The specific stated object for that purpose is, for instance, as follows: For each datum A stored in memory cells MC on (one and the same) bit line BL, the Boolean operation NAND should be used by means of a comparison datum X, which may have a different value for each datum A (that is, a succession of data Ap, where p=the number of word lines WL, is compared with a data word Xp that includes p different comparison data X).

If the data A are read out through the one bit line half BLH, then in order to perform the NAND operation, the one third mode select signal $\phi 4$ should be set constantly to logical 0, and the other third mode select signal $\phi 5$ should be set constantly to logical 1. However, if the data A are read out through the other bit line half $\overline{BLH}$, then in order to perform the NAND operation the one third mode select signal $\phi 4$ should be set constantly to logical 1, and the other third mode select signal $\phi 5$ should be set constantly to logical 0. The actual Boolean operation is then performed analogously to that described above in connection with the fourth mode MOD4, with the following substantial differences:

1) The third mode select signals $\phi 4$, $\phi 5$ have their abovegiven values of logical 0 or logical 1 constantly; they function as genuine control signals, not as a comparison datum X or a datum $\overline{X}$ complementary thereto, as in the fourth mode MOD4. Consequently, the one second transfer transistor TT2 is always blocked and the other second Lransfer transistor TT12 is always conducting.

2) If the logical comparison is to be performed in such a way that each datum A to be read out is to be compared with one (other) value of the comparison datum X (in the sense of the aforementioned data word Xp), then the corresponding comparison datum X of the data word Xp should be stored at the memory node S1 (or S11), before the corresponding datum A is read out and evaluated. However, if the various data Ap are to be compared with one and the same comparison datum X, then the latter needs to be stored in memory only once (that is, prior to the beginning of the readout process for the first datum A).

Due to the parallels with the fourth mode MOD4 already described above, one skilled in the art will require no further explanation. However, it should be noted that the charge states of the individual charge capacitors C (that is, the outcome of the logical operations) should be stored in memory cells MC of the memory cell field MCF through the bit line BL associated with the particular logic unit LU.

A Boolean AND operation is performed in such a way that first the Boolean NAND operation is performed, and its final outcome (that is, the charge state at the first terminal of the charge capacitor C) is inverted by means of the already-described second mode MOD2.

In order to perform the Boolean OR operation, the third mode select signals $\phi 4$, $\phi 5$ are switched around as compared with the previously described NAND operation (that is, in this example, the one mode select signal $\phi 4$ constantly has the value logical 1, while the other third mode select signal $\phi 5$ is constantly at the value logical 0).

The NOR operation is performed, analogously to the already-described AND operation, by first performing the OR operation as a fifth mode MOD5, and then performing the second mode MOD2.

The XOR operation is similar: For this, both third mode select signals $\phi 4$, $\phi 5$ are to be kept at logical 1; the XNOR function is attained through use of the second mode MOD2 after performing the fifth mode MOD5.

b) The word-line oriented type of the fifth mode MOD5 will now be explained.

The specific stated object for this purpose is approximately as follows: For each datum A stored in memory cells MC on (one and the same) word line, the Boolean NAND operation is to be used by means of a comparison datum X, and a different comparison datum X can (simultaneously) be present at each logic unit LU (that is, one complete comparison word Xi, where i=total number of logic units LU, is present at the entire block of logic units LU). The individual comparison data X are first stored in the manner already described in the memory nodes S1, S11. Then, if it has not yet been done, the charge capacitors C of the logic units LU are precharged to the fixed potential VDD or VSS.

Then, a certain word line WL is addressed, and the data A stored in the associated memory cells MC are read out on the bit lines BL and evaluated and amplified by the evaluator circuits AMPL. The third mode select signals $\phi 4$, $\phi 5$ then assume the values already described in paragraph a) of the fifth mode MOD5 (that is, in NAND/AND operation: $\phi 4$=logical 0, $\phi 5$=logical 1; in OR/NOR operation: $\phi 4$=logical 1, $\phi 5$=logical 0; in XOR/XNOR operation: $\phi 4$=$\phi 5$=logical 1 in each case for readout of the datum A on the one bit line half BLH).

As a result, for each logic unit LU, the datum A present on the particular bit line half BLH is compared, in accordance with the applied third mode select signals $\phi 4$, $\phi 5$, with the comparison datum X stored in the associated memory node S1 (or, the complementary datum $\overline{A}$ present on the other bit line half $\overline{BLH}$ is compared with the complementary datum $\overline{X}$ stored in the associated memory node Sll). The outcome of the Boolean operation (in the selected example, the NAND operation) resulting from the comparison in each individual logic unit LU determines the potential state of the associated charge capacitor C, analogously to the modes already described. As has also already been described, this outcome is again invertible (second mode MOD2), and can be read out through the evaluator circuits AMPL and the data output of the semiconductor memory and can be stored in the memory cell field MCF. Moreover, the third mode MOD3 can be used in parallel for the charge capacitors C of the entire block of logic units LU.

Figure 7:
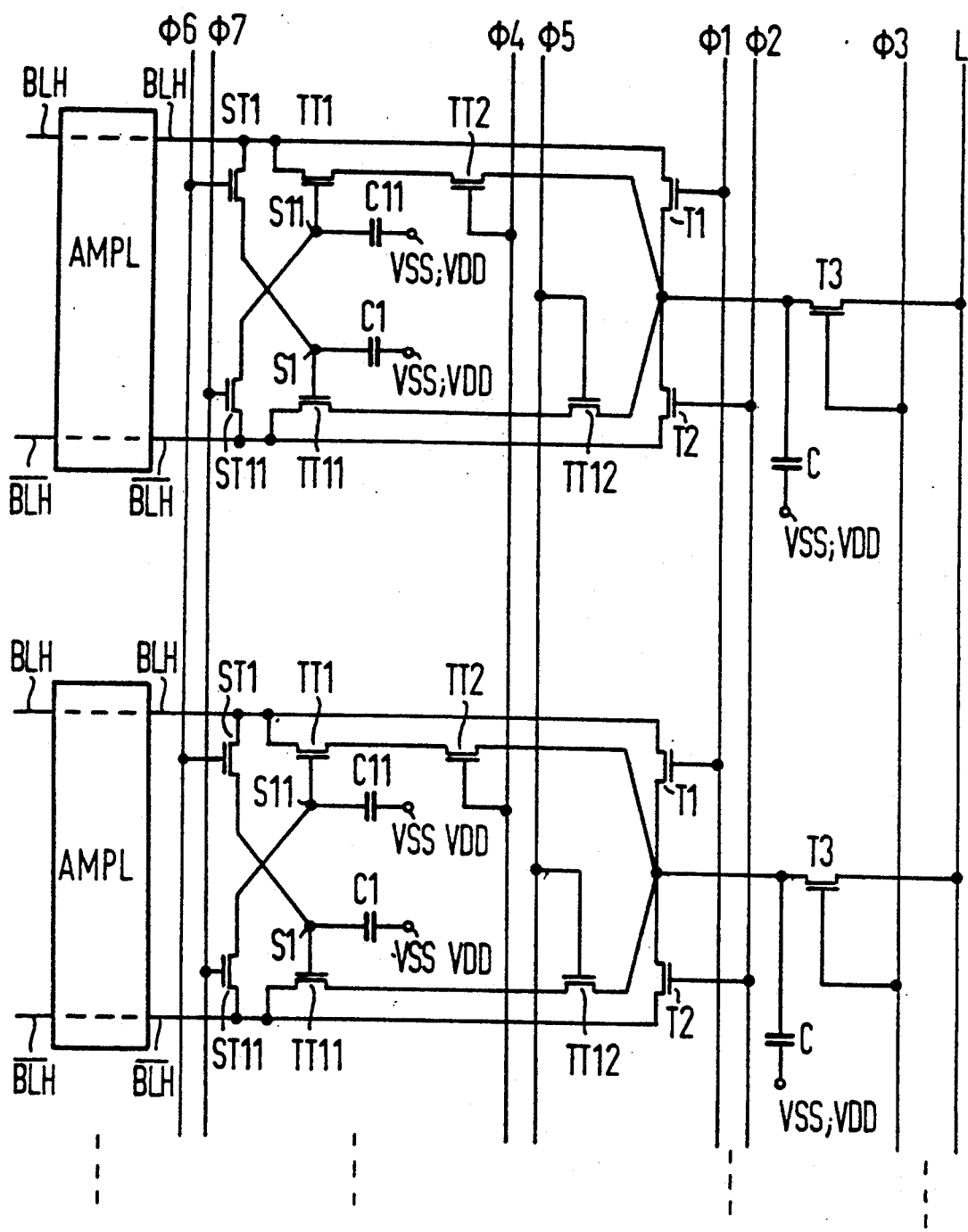

The embodiment of FIG. 7 is distinguished from that of FIG. 6 in that instead of a single fourth mode select signal $\phi 6$, it has two independently triggerable fourth mode select signals $\phi 6$, $\phi 7$. The one fourth mode select signal $\phi 6$ is connected, in each logic unit LU, to the gate of the one memory transistor ST1. The other fourth mode select signal $\phi 7$, in contrast, is connected in each logic unit LU to the gate of the other memory transistor ST11. With this embodiment, the above-described fifth mode MOD5 is possible, with its individual various operations, by using "masking bits": If one specific logic unit LU (or more) of the block of logic units LU is not going to be used for performing the fifth mode MOD5 (that is, for instance, if the charge state of its charge capacitor C is to be maintained without change, regardless of any data), then a value should be stored in both memory nodes S1, S11 of the logic unit LU that reliably blocks both first transfer transistors TT1, TT11 (in the case of n-channel transistors, accordingly, the value "logical 0"). Thus the charge capacitor C cannot be discharged.

The two bit line halves BLH, $\overline{BLH}$ by way of which the comparison datum X (and the datum X complementary to it) is loaded into the memory nodes S1, S11 are known to always have electrical states complementary to one another. Accordingly, by activation of the fourth mode select signal $\phi 6$ in FIG. 6, both memory nodes S1, S11 cannot simultaneously store the same value that blocks both first transfer transistors TT1, TT11. This can be attained, however, by using two different mode select signals $\phi 6$, $\phi 7$ independent of one another: On the assumption that the value to be stored, "logical 0", blocks both first transfer transistors TT1, TT11, the procedure is as follows:

First, the one bit line half BLH is occupied (by known means, already described) by the value "logical 0". Then the one fourth mode select signal $\phi 6$ is activated, so that the applied "logical 0" reaches the one memory node S1. By ensuing deactivation of the one fourth mode select signal $\phi 6$, the "logical 0" remains stored on the one memory node S1, and the other first transfer transistor TT11 connected to it remains reliably blocked.

Next, the other bit line half $\overline{BLH}$ is occupied by the value "logical 0". Then the other fourth mode select signal $\phi 7$ is activated, so that the applied "logical 0" reaches the other memory node S11. By ensuing deactivation of the one fourth mode select signal $\phi 7$, the "logical 0" remains stored on the one memory node S11, and the one first transfer transistor TT1 connected to it likewise remains reliably blocked. If in an embodiment according to FIG. 6 or FIG. 7 the modes MOD3 or MOD4 are performed, then the fourth mode select signals $\phi 6$, $\phi 7$ should be kept constantly activated. When the second mode MOD2 is performed, the state of the fourth mode select signals $\phi 6$, $\phi 7$ has no effect, because the third mode select signals $\phi 4$, $\phi 5$ are deactivated. In order to perform the first mode MOD1, as already described, all of the mode select signals $\phi j$ should be kept inactive.

Figure 8:
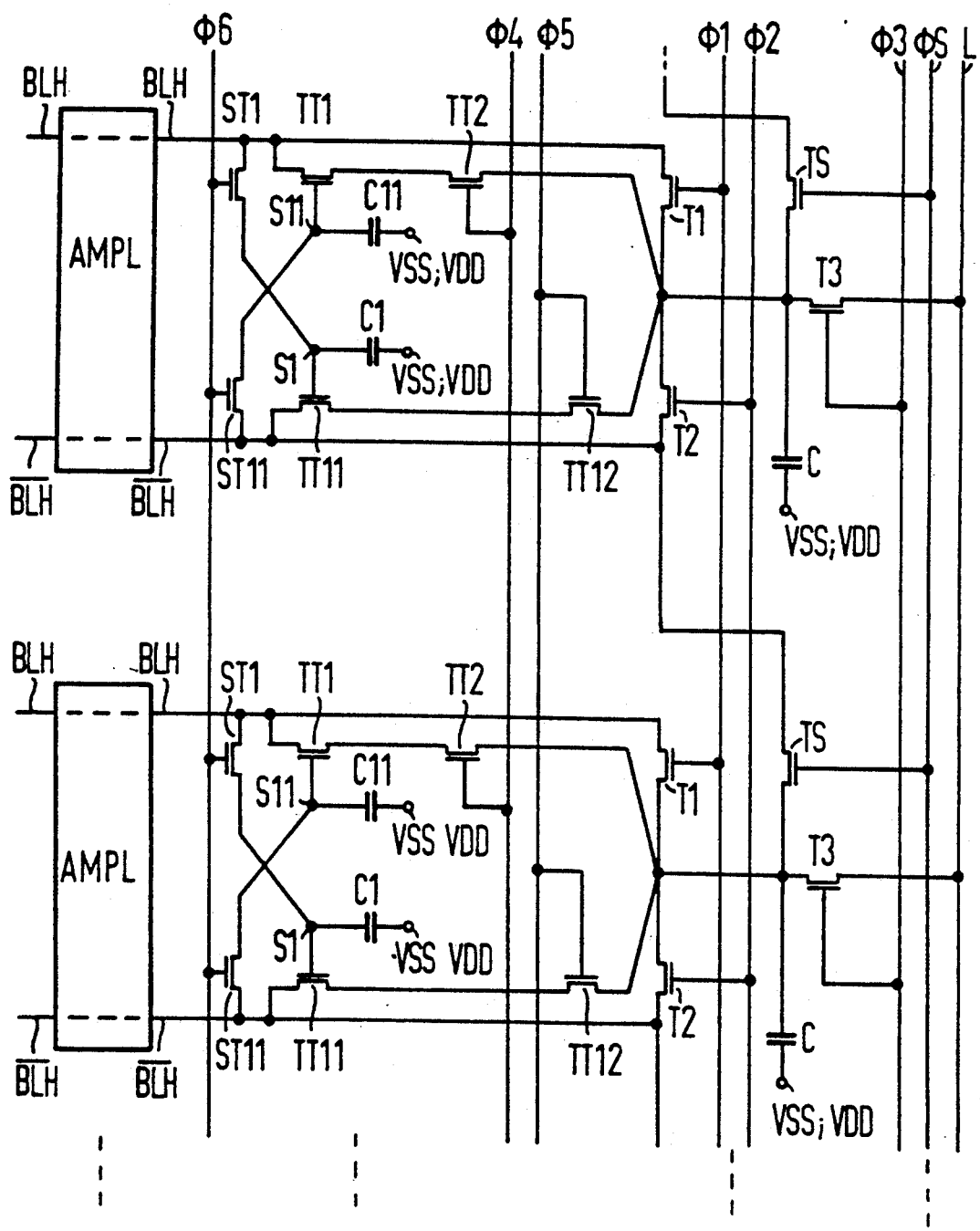
Figure 9:
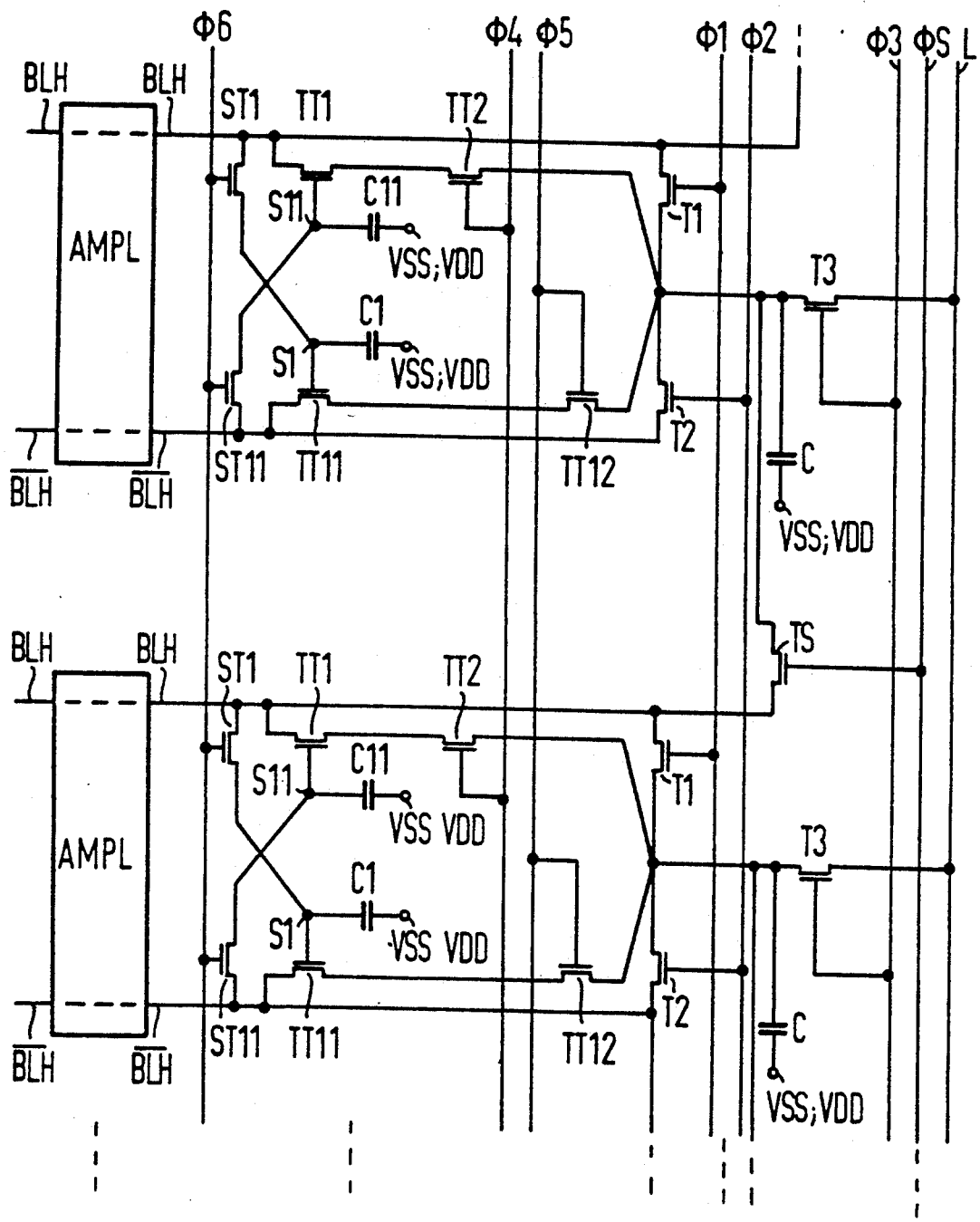

FIGS. 8 and 9 show further possible embodiments of the invention. With them, data Ai, which are stored in memory cells MC along a word line WL and read out of it (in parallel) and evaluated, can be added to or subtracted from comparison data Xi, which are stored in the memory nodes S1. They also enable multiplication and division, because these operations, as is well known, are merely an iterative performance of addition and subtraction, respectively. These arithmetic operations are a sixth mode MOD6 of the circuit according to the invention. Compared with the embodiment of FIG. 7, the circuits of FIGS. 8 and 9 additionally each have one shift transistor TS, which has its current-carrying path (=channel) disposed between the first terminal of the charge capacitor C of a logic unit LU and the bit line BL before it (FIG. 8) or after it (FIG. 9) in the order of individual logic units LU. Whether the connection is made to the one bit line half (BLH) or the other ($\overline{BLH}$) is of no significance in principle for the functions that can be performed. The gates of the shift transistors TS are connected in common to a shift signal 0S, which acts as a fifth mode select signal. This configuration makes a shift register function possible: The potential stored at one charge capacitor C can thus be shifted onward to the corresponding adjacent bit line BL, and from there through one of the two transistors T1, T2 it can be shifted to the charge capacitor C connected thereto.

In the embodiment of FIG. 8, the most significant bit of the one operand (for instance, of the data Ai) is located on the first bit line, in an observed order (from top to bottom) of the bit lines BL. In contrast, in the embodiment of FIG. 9, the most significant bit is on the last bit line BL in the order observed.

In principle, addition proceeds as follows: First, the one operand (one comparison datum X per logic unit LU) is stored in the one memory node S1 (or S11) of the logic units LU. Then the other operand (as datum A per bit line) is read out in parallel from all of the memory cells MC connected with a certain addressed word line WL, and evaluated and amplified. Both operands, as described already with reference to the fourth mode MOD4, are then linked together by means of the Boolean XOR operation (this is equivalent to a so-called "half addition"); the outcome is dictated by the charge state then ensuing for each individual charge capacitor C. This outcome is then inscribed back into the memory cell field MCF, by addressing another word line WL. Next, the originally addressed word line WL is addressed once again, as a result of which the data A stored therein reach the bit lines BL (again). Then the Boolean AND operation is performed, as a fourth mode MOD4, for the data A and the (still-stored) comparison data X. Thus per logic unit LU, the result is the so-called remainder ("carry bit") at the charge capacitor C. By activation of the shift signal 0S, this remainder is then shifted on to the adjacent bit line, on which it is evaluated and amplified by means of the evaluator circuit AMPL. The shift signal 0S is deactivated again. The remainders handled in this way are then stored in the one memory node S1 of the particular logic unit LU. Then, the word line by means of which the outcome of the previously described XOR operation was stored in memory is addressed. This outcome is again read out to the bit lines, evaluated, amplified, and by means of the fourth mode MOD4 subjected to the Boolean XOR operation in terms of the remainder stored in the memory node S1. The result of this is then the overall result of the addition.

In subtraction, first the second mode MOD2 (inversion) is performed, and then the sixth mode MOD6. Division is also possible by repeated subtraction.

It is particularly advantageous if, for the first logic unit LU in order, the first terminal of the charge capacitor C is connected through the shift transistor TS with the last bit line BL in order or if, for the last logic unit LU in order, the first terminal of the charge capacitor C is connected through the shift transistor TS with the first bit line in order. With these embodiments, the operations known as modulo addition and modulo subtraction are then possible.

The buffer store capacitors C1, C11 need not necessarily be made in the form of separate switching elements.

For this purpose, it is advantageous to exploit the stray capacitance effects of the first transfer transistors TT1, TT11 (for example, their gate oxide capacitors).

It is also advantageous if the charge capacitors C are replaced with static memory cells.

The memory cells MC of the memory cell field MCF can advantageously be either of the dynamic random access cell type or of the static random access cell type, or of the non-volatile type, such as EPROM and EEPROM.

The integrated semiconductor circuit according to the invention also offers the opportunity of performing still other operations which are not described herein, by combining the various described modes MODk.

The foregoing is a description corresponding in substance to European Application 88 11 3074.4, dated Aug. 11, 1988 International priority of which is being claimed for the instant application, and which is hereby made part of this application. Any material discrepancies between the foregoing specification and the aforementioned corresponding European application are to be resolved in favor of the latter.

What is claimed is:

1. An integrated semiconductor circuit, comprising:
    a plurailty of word lines and a plurality of bit lines, each bit line including a pair of complementary bit line halves;
    a memory region including at least one memory cell field, each memory cell field including a plurailty of memory cells addressable by said word lines and said bit lines;
    A plurality of sense amplifiers, each connected to a respective bit line;
    A plurality of logic units, each connected to a respective sense amplifier for digitally processing data received from said sense amplifiers; and
    mode selecting means connected to said logic units for selecting different operating modes of said logic units by means of mode select signals; mode select signal deactivating means connected to said mode selecting means for deactivating said mode select signals; including in each of said logic units: a first and a second transistor, each having a source, a drain and a gate, for logic inversion of said data; and a charge capacitor having a first and a second terminal, wherein the drain of said first and second transistor is connected to the first terminal of said charge capacitor, the source of said first transistor is connected to one of said bit line halves, and the source of the second transistor is connected to the other one of said bit line halves, and wherein said mode select signals include two first mode select signals.

2. An integrated semiconductor circuit according to claim 1 including a common line common to said logic units, having a charge state, means for precharging said common line to a fixed potential, a third transistor having a source, a drain, and a gate in each of said logic units connected with its source and drain between said first terminal of said charge capacitor and said common line, a discriminator circuit connected to said common line ror recognizing the charge state of said common line, including a second mode in said mode select signals connected to the gate of said third transistor for performing a number equal to "i" of logic comparisons between the data received from said sense amplifiers and the state of said common line; wherein the number "i" is equal to the plurality of logic units.

3. Integrated semiconductor circuit according to claim 2, including a support capacitor connected between said common line and a fixed potential.

4. Integrated semiconductor circuit according to claim 2, including two first and two second transfer transistors having channels and gates,
    one of said first and one of said second transfer transistors being connected with the channels thereof in series between the drains of said two first transistors and one of said two bit line halves, the other of said first and the other of said third transfer transistors being connected with the channels thereof in series between the drains of said two first transistors and the other of said two bit line halves;
    said mode select signals including two second mode select signals each being fed to the gate of a respective one of said two second transfer transistors;
    the gate of said one first transfer transistor being connected to said other bit line half, and the gate of said other first transfer transistor being connected to said one bit line half.

5. Integrated semiconductor circuit according to claim 4, including two buffer store capacitors having first and second electrodes,
    the gates of said two first transfer transistors each being connected to the first electrode of a respective one of said two buffer store capacitors, defining two respective memory nodes therebetween;
    the second electrodes of said buffer store capacitors being connected to a fixed potential;
    memory transistors having channels and gates, each of said channels of said memory transistors being connected between a respective one of said two memory nodes and a corresponding one of said bit line halves; and
    said mode select signals including a fourth mode select signal connected to the gates of said memory transistors.

6. Integrated semiconductor circuit according to claim 4 including two buffer store capacitors having first and second electrodes,
    the gates of said two first transfer transistors each being connected to the first electrode of a respective one of said two buffer store capacitors, defining two respective memory nodes therebetween;
    the second electrodes of said buffer store capacitors being connected to a fixed potential;
    memory transistors having channels and gates, each of said channels of said memory transistors being connected between a respective one of said two memory nodes and a corresponding one of said bit line halves; and
    said mode select signals including two third mode select. signals each being connected to the gate of a respective one of said memory transistors.

7. Integrated semiconductor circuit according to claim 5, wherein each of said logic units includes a shift transistor having a channel and a gate,
    the channel of said shift transistor being connected between the first terminal of said charge capacitor and one of said bit line halves of an adjacent bit line; and
    said mode select signals including a fifth mode select signal fed to the gate of said shift transistor as a shift signal.

8. Integrated semiconductor circuit according to claim 6, wherein each of said logic units includes a shift transistor having a channel and a gate, the channel of said shift transistor being connected between the first terminal of said charge capacitor and one of said bit line halves of an adjacent bit line; and said mode select signal including a fifth mode select signal fed to the gate of said shift transistor as a shift signal.

9. Integrated semiconductor circuit according to claim 7, wherein said logic units and said bit lines are disposed in a given order from a first logic unit and a first bit line to a last logic unit and a last bit line, and the first terminal of said charge capacitor is connected through said shift transistor in said first logic unit with said last bit line, as seen in said given order.

10. Integrated semiconductor circuit according to claim 8, wherein said logic units and said bit lines are disposed in a given order from a first logic unit and a first bit line to a last logic unit and a last bit line, and the first terminal of said charge capacitor is connected through said shift transistor in said first logic unit with said last bit line, as seen in said given order.

11. Integrated semiconductor circuit according to claim 7, wherein said logic units and said bit lines are disposed in a given order from a first logic unit and a first bit line to a last logic unit and a last bit line, and the first terminal of said charge capacitor is connected through said shift transistor in said first logic unit with said last bit-line, as seen in said given order.

12. Integrated semiconductor circuit according to claim 8, wherein said logic units and said bit lines are disposed in a given order from a first logic unit and a first bit line to a last logic unit and a last bit line, and the first terminal of said charge capacitor is connected through said shift transistor in said last logic unit with said first bit line, as seen in said given order.

13. Integrated semiconductor circuit according to claim 5, wherein said buffer store capacitors are stray capacitances of said first transfer transistors.

14. Integrated semiconductor circuit according to claim 1, including static memory cells providing said charge capacitors of each of said logic units.

15. Integrated semiconductor circuit according to claim 1, wherein said memory cells are dynamic random access memory cells.

16. Integrated semiconductor circuit according to claim 1, wherein said memory cells are static random access memory cells.

17. Integrated semiconductor circuit according to claim 1, wherein said memory cells are memory cells of the non-volatile type.

* * * * *